United States Patent [19]

Douglas et al.

[11] Patent Number: 5,159,616
[45] Date of Patent: Oct. 27, 1992

[54] CMOS SHIFT REGISTER WITH COMPLEMENTARY REFRESH PASS GATES AND BUFFER

[75] Inventors: Chet R. Douglas, Colorado Springs, Colo.; Michael E. Kastner, Northboro; Floyd Rinne, Marlboro, both of Mass.

[73] Assignee: Digital Equipment Corporation, Maynard, Mass.

[21] Appl. No.: 603,790

[22] Filed: Oct. 25, 1990

[51] Int. Cl.⁵ .................. G11C 19/28; H03K 23/44
[52] U.S. Cl. .......................... 377/79; 377/105; 377/117
[58] Field of Search ............ 377/70, 74, 79, 117, 377/105; 307/290

[56] References Cited

U.S. PATENT DOCUMENTS

| | | | |
|---|---|---|---|
| 4,084,107 | 4/1978 | Ohba et al. | 377/79 |
| 4,250,406 | 2/1981 | Alaspa | 377/79 |
| 4,495,629 | 1/1985 | Zasio et al. | 377/70 |
| 4,571,504 | 2/1986 | Iwamoto et al. | 307/290 |
| 4,705,965 | 11/1987 | Stuyt | 377/117 |

FOREIGN PATENT DOCUMENTS

| | | | |
|---|---|---|---|
| 3428393 | 2/1986 | Fed. Rep. of Germany | 377/79 |
| 0079599 | 5/1985 | Japan | 377/79 |

OTHER PUBLICATIONS

IBM Tech. Disclosure Bul. vol. 12 No. 12 May 1970

"Complementary FET Dynamic Shift Register Using a Single Phase Line" by Gaensslen et al.

Primary Examiner—John S. Heyman
Attorney, Agent, or Firm—Cesari and McKenna

[57] ABSTRACT

The improved CMOS shift register consists of a series of alternating PMOS and NMOS pass gates driven by a single clock signal. Each gate consists of either one or more PMOS transistor(s), or one or more NMOS transistor(s). When the clock signal goes low, the PMOS gates turn on and pass bit values. At the same time the adjacent NMOS gates, which are driven by the same low clock signal, shut off and prevent the passed bit values from traveling any further. The bit values are thus held between adjacent PMOS and NMOS gates. When the clock signal next goes high, the NMOS gates turn on and pass the held bit values while the PMOS gates driven by the same high clock shut off. The gates are connected by circuitry which essentially holds the bit values passed through the first associated gate until they are passed through the second associated gate. The shift register may also include gated or non-gated refresh circuitry, which operates to maintain a passed bit value. The refresh circuitry may include gates which are the complements of the associated pass gates, with all the gates driven by the same clock signal.

4 Claims, 6 Drawing Sheets

CMOS SHIFT REGISTER WITH COMPLEMENTARY REFRESH PASS GATES AND BUFFER

FIELD OF INVENTION

The invention relates generally to shift registers, and more particularly to CMOS shift registers using a single clock signal.

BACKGROUND

Known CMOS shift register circuits require, to operate properly, two complementary clock signals. Shift registers include a series of "pass gates" through which data bits are conducted, or passed. Conventional CMOS pass gates consist of a PMOS transistor and an NMOS transistor with their drains and sources tied together. One of the two clock signals drives the gate of the PMOS transistor and the other clock signal drives the gate of the NMOS transistor.

For a gate to pass a data bit, both its transistors must be turned on. In order to turn on, the PMOS transistor requires a low clock signal and the NMOS transistor requires a high clock signal. Accordingly, the clock signal driving the PMOS transistor must be 180° out of phase with the clock signal driving the NMOS transistor. If the two clock signals are not precisely 180° out of phase the gate transistors may not turn on together, and thus, the gate may not pass a particular bit value at the desired frequency.

As discussed in more detail below, known CMOS shift registers include a number of pass gates connected in series, with adjacent gates connected by circuitry which essentially holds a passed bit value. The gates are grouped in pairs to form a series of "cells." A "shift" of a shift register consists of passing a bit from one cell to the next.

The gates in a cell are arranged such that the first gate conducts during a first portion of a clock cycle and the second gate conducts during a second portion of the clock cycle. For example, a cell may be arranged with the PMO transistor of the first gate driven by one of the clock signals and the PMOS transistor of the second gate driven by the second, or complementary, clock signal. Accordingly, a bit is shifted from one cell to the next in one full clock cycle.

CMOS shift register circuits typically include clock generation and compensation circuitry to ensure that the two clock signals remain 180° out of phase at all points along the clock lines. As the speeds at which shift registers operate increase, and accordingly the clock rates increase, it becomes more and more important to keep the two required clock signals precisely 180° out of phase, or complementary, at all points along the routed clock lines. Otherwise, the clock signals may drive the gate transistors of adjacent cells to turn on simultaneously, and thus, the pass gates may not properly sequence bit values.

The clock signals must also have fast edge rates to prevent successive pass gates from conducting at the same time. For example, a gate driven by low clock and high complementary clock signals must turn off before the next gate, which is driven by high clock and low complementary clock signals, turns on. If these gates are simultaneously conducting, a bit value passed through the first gate may continue through the second gate. The bit is then essentially lost because it is in the wrong register position. As the clock speeds increase, it is more and more difficult to keep the two required clock signals, with their fast edge rates, precisely 180° out of phase.

SUMMARY

The invention is a CMOS shift register which consists of alternating PMOS and NMOS pass gates driven by a single clock signal. Each gate consists of either one or more PMOS transistor(s), or one or more NMOS transistor(s). Accordingly, when the clock signal goes low, the PMOS gates turn on and pass bit values. At the same time the adjacent NMOS gates, which are driven by the same low clock signal, shut off and prevent the passed bit values from traveling any further. The bit values are thus held between adjacent PMOS and NMOS gates.

When the clock signal next goes high, the NMOS gates turn on and pass the held bit values while the PMOS gates driven by the same high clock shut off. The PMOS gates and the NMOS gates do not pass bit values at the same time, and thus, there is no need for a second, or complementary, clock signal.

In brief summary, a cell of the inventive shift register includes a first pass gate, for example, a PMOS gate, a second pass gate, for example, an NMOS pass gate, and connecting circuitry which holds the passed bit values. A cell may also include refresh circuitry, which operates to maintain a passed bit value while it is being held in the cell.

The PMOS and NMOS pass gates are all driven by the same clock signal. Accordingly, the PMOS gate turns on and passes a bit value into the cell while the NMOS gate is shut off. Next, the PMOS gate shuts off and the NMOS gate turns on to pass the bit value to a succeeding cell. Before the NMOS gate passes the bit value, refresh circuitry refreshes the latched bit value. The refresh circuitry may be gated or non-gated, depending on the desired operating characteristics of the register.

For high speed applications, for example, the shift register may include an NMOS gate in the gated refresh, or feedback, path of a PMOS pass gate, and a PMOS gate in the gated feedback path of an NMOS pass gate, with all the gates being driven by the same clock. When the clock is low the PMOS pass gate turns on to pass bit values, and the NMOS gate in the associated feedback path is shut off. Similarly, when the clock is high, the NMOS pass gate conducts and the PMOS gate in the associated feedback path is shut off. When the various conducting pass gates shut off, the associated feedback gates turn on and act as current sources to refresh the passed bit values. However, when the conducting gates turn on, the associated feedback paths shut off, and thus, they no longer act as high impedance current sources which must otherwise be overcome by the conducting gates.

BRIEF DESCRIPTION OF THE DRAWINGS

The invention will be pointed out with particularity in the appended claims. The above and other advantages of the invention may be better understood by referring to the following description taken in conjunction with the accompanying drawings, in which:

DETAILED DESCRIPTION

Figure 1:
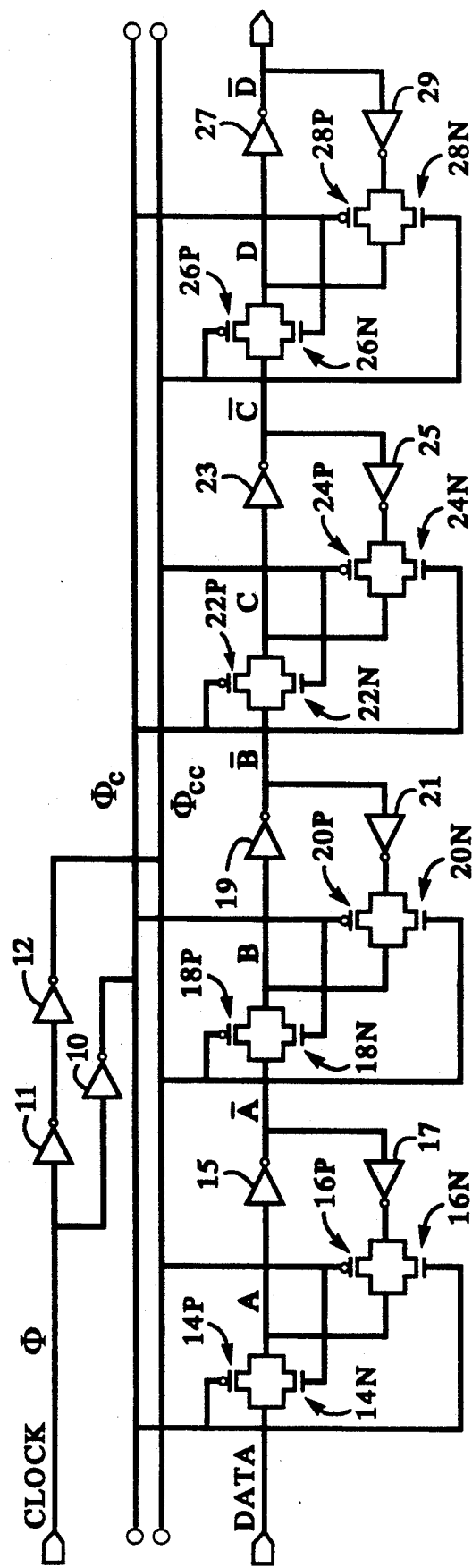
FIG. 1 is a circuit diagram of a prior art CMOS shift register.

FIG. 1 is a circuit diagram of a CMOS shift register constructed in accordance with prior technology. The shift register includes pass gates 14, 18, 22 and 26, inverters 15, 19, 23 and 27 for holding passed bit values and various refresh inverters and transistors for refreshing the held values. The shift register also requires clock generating and clock compensating circuitry, as discussed below. Pass gates 14 and 18 and the associated holding and refresh circuitry form one cell and pass gates 22 and 26 and the associated holding and refresh circuitry form a second cell.

A master clock (generator not shown) provides to the shift register a master clock signal, $\phi$. From this master clock signal, $\phi$, the clock generating circuitry, 10-12 generates the two required clock signals, namely, clock signal, $\phi_c$, and complementary clock signal, $\phi_{cc}$. The clock generating circuitry 10-12 must delay the clock signal, $\phi_c$, such that it is 180° out of phase with the complementary clock signal, $\phi_{cc}$. Thus the delay of inverter 10 must be precisely matched to the combined delay of the inverters 11 and 12.

When the clock signal, $\phi_c$, is low, gate 14 conducts, that is, PMOS transistor 14P which is driven by the low clock signal, $\phi_c$, and NMOS transistor 14N which is driven by the high clock signal, $\phi_{cc}$, turn on. The gate thus passes the bit value A into the first cell, to inverter 15. The bit value A is "written" in the cell when the inverter 15 latches to its output port the inverse of the passed value, or "inverse A." The inverter 15 then holds the inverse of the passed value while gate 18 conducts and passes the bit value out of the cell.

The output signal from inverter 15, that is, inverse A, becomes the input signal for refresh, or feedback, inverter 17. When the feedback pass gate 16 turns on, it passes to the input of inverter 15 the output signal of the feedback inverter 17. Thus it passes the value A to the inverter. Inverter 15 is refreshed by this bit value, and it remains in its then current condition. When the clock, signal $\phi_c$, next goes high and its complement, $\phi_{cc}$, goes low, they turn on transistors 18P and 18N of pass gate 18. The gate then passes the inverse of the held value A to the next cell.

The feedback pass gate 16 includes complementary transistors 16P and 16N, with the gate of transistor 16N driven by the clock signal, $\phi_c$, and the gate of transistor 16P driven by the complementary clock signal, $\phi_{cc}$. The feedback gate 16 thus conducts during a different portion of the clock cycle than does pass gate 14. Accordingly, the feedback pass gate 16 shuts off when the associated pass gate 14 conducts, thereby preventing the refresh circuitry from acting as a high impedance current source, and conducts when the gate 14 is shut off, thereby refreshing the held bit value.

A gate conducts a bit value when both transistors are turned on, and it blocks a bit value from traveling further when both transistors are turned off. As discussed above, the two clock signals, $\phi_c$ and $\phi_{cc}$, must remain 180° out of phase in order to turn on and turn off the various pass and feedback CMOS gates at the proper times. Otherwise, pass gates may continue to conduct when they should be off and values are passed too far, or feedback gates may remain off when they should be conducting and a passed value may not be properly refreshed, and so forth.

To this end, the prior art shift register includes clock generation circuitry, namely, gates 10, 11, 12, and other compensation circuitry (not shown). The clock generation circuitry must be repeated locally for each shift cell, or at various points along the clock lines, as appropriate, to maintain the phase difference of the clock signals. The circuitry thus increases the number of transistors required in the shift register, which increases its size and complexity.

Figure 2:
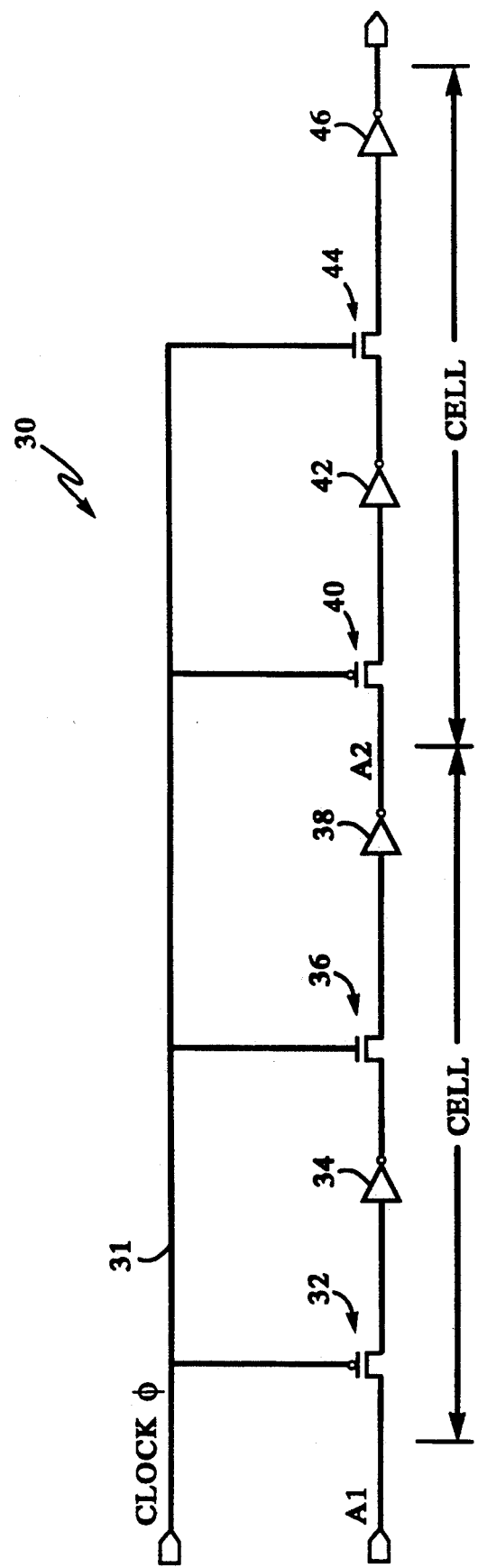
FIG. 2 is a circuit diagram of a dynamic shift register constructed in accordance with the invention.

FIG. 2 is a circuit diagram of two cells of a shift register 30 constructed in accordance with the invention. The shift register 30 includes pass gates 32, 36, 40 and 44, which are alternating NMOS and PMOS transistors with their gates tied to a single clock line 31. The pass gates are interconnected by inverters 34, 38, 42 and 46. The inverters hold the bit values passed by the previous associated pass gate, and the values are then passed through the next associated pass gate. Gates 32 and 36 and inverters 34 and 38 form a first cell, and gates 40 and 44 together with inverters 42 and 46 form a second cell.

The shift register 30 is dynamic and thus the register must be shifted, that is, the bit values must be passed often from one cell to the next. Otherwise, a passed value, may, for example, deteriorate from a binary ONE, to a binary ZERO due to normal node leakage.

The inverters 34, 38, 42 and 46 are level-sensing inverters, which compensate for signal levels which deteriorate as values are passed through the PMOS and NMOS gates. Specifically, when a PMOS transistor, for example, transistor 40, passes a binary ZERO, the transistor stops conducting prior to fully discharging the input to inverter 42. Inverter 42 thus receives a degraded binary ZERO signal. Similarly, when an NMOS transistor, for example, transistor 44, passes a binary ONE, it stops conducting prior to fully charging the input to inverter 46. Inverter 46 thus receives a degraded binary ONE signal. The PMOS transistor does not, however, adversely affect the voltage level of a binary ONE and the NMOS transistor does not adversely affect the voltage level of a binary ZERO. Accordingly, the associated inverters receive supply-level voltage levels for these logic states.

The signal passing characteristics of the PMOS and NMOS transistors are attributable to the basic physics of the respective transistors. Accordingly, the inverters associated with the PMOS gates, namely, inverters 34 and 42, are designed to treat any voltage less than 20% of the supply voltage (VDD) as a logical ZERO, and the inverters associated with the NMOS gates, namely, inverters 38 and 46, are designed to treat any voltage greater than 80% of the supply voltage (VDD) as a logical ONE. The level-sensing inverters then produce full supply-level signals corresponding to the binary inverses of the received logical ZERO and ONE signals. These signals are next passed to the succeeding cells as binary ONES and binary ZEROS, respectively.

Referring still to FIG. 2, when the clock signal, $\phi$, is low, pass gates 32 and 40 turn on and pass the values $A_1$ and $A_2$ into the first and second cells, respectively.

Inverters 34 and 42 then invert the passed values to binary-valued inverse $A_1$ and inverse $A_2$. As the clock signal rises, the PMOS pass gates 32 and 40 shut off and the NMOS pass gates 36 and 44 turn on. The NMOS pass gates 36 and 44 then pass the inverse $A_1$ and inverse $A_2$ values to inverters 38 and 46, and the inverters 38 and 46 invert the passed values to binary-valued $A_1$ and $A_2$, respectively. When the clock signal again goes low it turns off the NMOS pass gates 36 and 44 and again turns on the PMOS pass gates 32 and 40. PMOS pass gate 40 passes the value $A_1$, while pass gate 32 passes a value $A_0$ (not shown).

The shift register 30 requires only one clock signal, $\phi$, and thus, it does not require the clock generation or clock compensation circuitry discussed above with reference to FIG. 1. Accordingly, the shift register 30 requires fewer circuit components than does the shift register described above, and it is both smaller and less complex.

The clock signal, $\phi$, like the signals $\phi_c$ and $\phi_{cc}$ (FIG. 1), must have a fast edge-rate in order to avoid driving successive gates to conduct at the same time. However, providing a single fast-edge-rate clock signal to the register is much less of a problem than providing two such clock signals which must remain 180° out of phase, as described above.

Shift register 30 does not include any refresh circuitry. Accordingly, any stored or held signals may deteriorate over time, due to normal node leakage. Thus register 30 is best suited for high-frequency applications, where the clock signal causes the pass gates to pass values at continuous, regular intervals.

Figure 3:
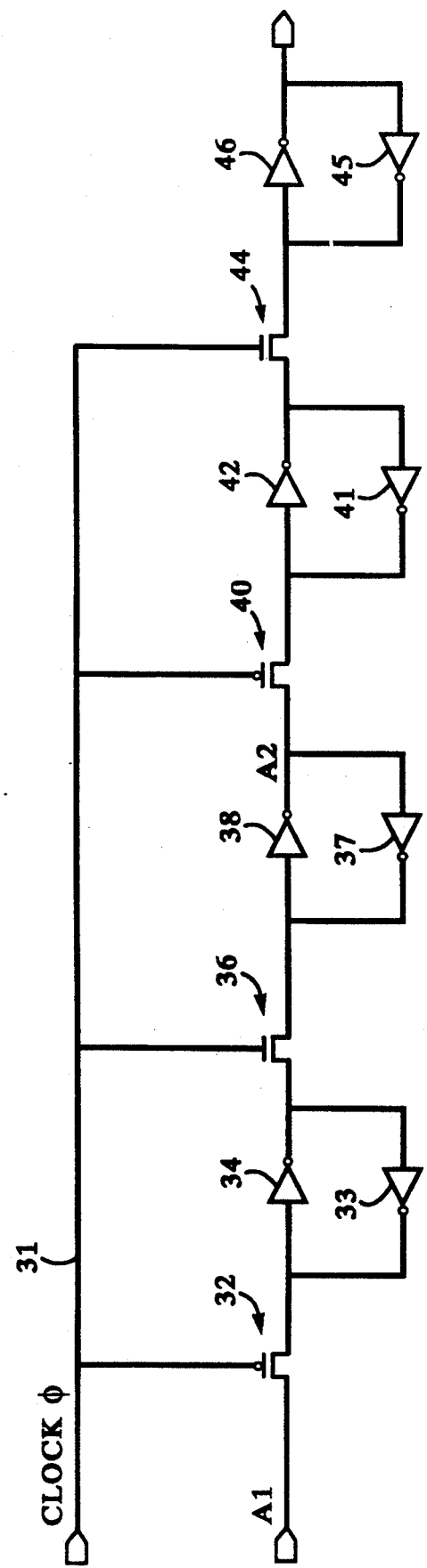
FIG. 3 is a circuit diagram of the shift register of FIG. 2 with static or non-gated refresh circuitry.

FIG. 3 is a diagram of a second embodiment of the invention. FIG. 3 depicts the shift register 30 of FIG. 2 with added refresh circuitry. The elements of FIG. 3 which are the same as the elements of FIG. 2 have been assigned the same reference numerals.

The first cell consists of pass gates 32 and 36 and associated connecting and refresh circuitry, specifically inverters 34, 38 and 33, 37. When, for example, the clock signal, $\phi$, is low, PMOS pass gate 32 passes to level-sensing inverter 34 the bit value $A_1$, which in this example is a binary ZERO. As discussed above with reference to FIG. 2, PMOS pass gates shut off before fully discharging a binary ZERO input to a connected inverter. Thus inverter 34 receives a degraded logical ZERO signal, which it inverts to a full supply-level binary ONE. The inverter 34 then supplies the inverted signal to the NMOS gate 36 and the feedback inverter 33.

Feedback inverter 33 maintains or refreshes the signal at the input of inverter 34 as a binary ZERO by supplying to it the inverse of the received binary ONE. The feedback inverter 33 must have a relatively high impedance, that is, the inverter 33 must be relatively weak, to avoid writing the refresh value backward through PMOS gate 32 when the gate turns on to conduct forward.

The added refresh circuitry, which supplies feedback current to compensate for normal node leakage, enables the shift register to pass values at any frequency. The shift register is thus not limited to the virtually continuous operation of the dynamic register of FIG. 2. However, the pass gates require a finite amount of time to overcome the feedback current. Thus this register may not be suitable for high frequency operation. Instead, it is best suited for medium to low-frequency applications.

Figure 4:
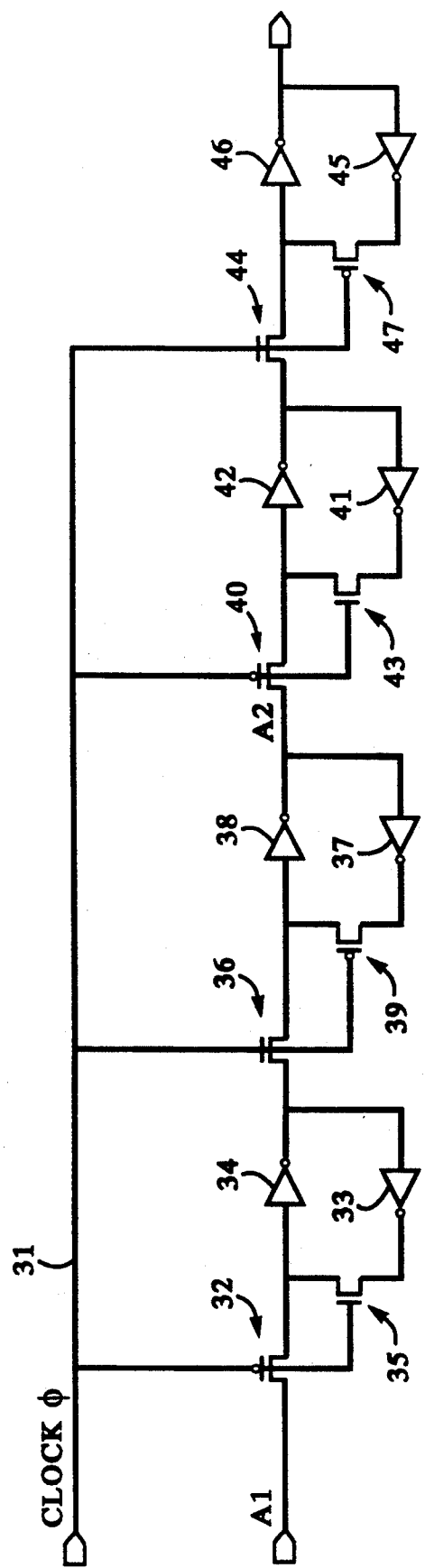
FIG. 4 is a circuit diagram of a second embodiment of the shift register shown in FIG. 3 with gated refresh circuitry.

FIG. 4 illustrates a third embodiment of the current invention, which may be used when a high-speed shift register is required. FIG. 4 depicts the shift register of FIG. 3 with gated refresh circuitry. Again, elements which are the same in the previous two Figures have been assigned the same numerals.

Referring now to FIG. 4, the shift register includes, in each refresh, or feedback, loop, a feedback gate such as feedback gate 35. The feedback gates are complements of the associated pass gate transistors. Thus the feedback gate 35 associated with PMOS pass gate 32 is an NMOS transistor.

All of the pass gates and feedback gates in the register are driven by a single clock signal, $\phi$. Thus the feedback gates, and consequently the feedback loops, are shut off when the associated pass gates are conducting. Accordingly, the pass gates do not have to overcome the feedback circuitry impedance before they can pass values. The gates can thus pass values more quickly than can the gates of the register shown in FIG. 3. Further, inverter 33 need not be weak, like the inverters of FIG. 3, which means that the geometries of the refresh circuitry can be of minimal dimension.

The feedback gates operate to refresh passed bit values when the associated pass gates are shut off. These feedback gates in conjunction with the level-sensing inverters restore the held bit values to their proper levels as the values are passed to the next cells via the succeeding pass gates. However, since the various inverter-feedback gate combinations restore only one of the two possible logic states to its full level, i.e., the NMOS gate combination fully restores only a logical ZERO and the PMOS gate combination fully restores only a logical ONE, this register may not be suitable for low-frequency operation.

Figure 5:
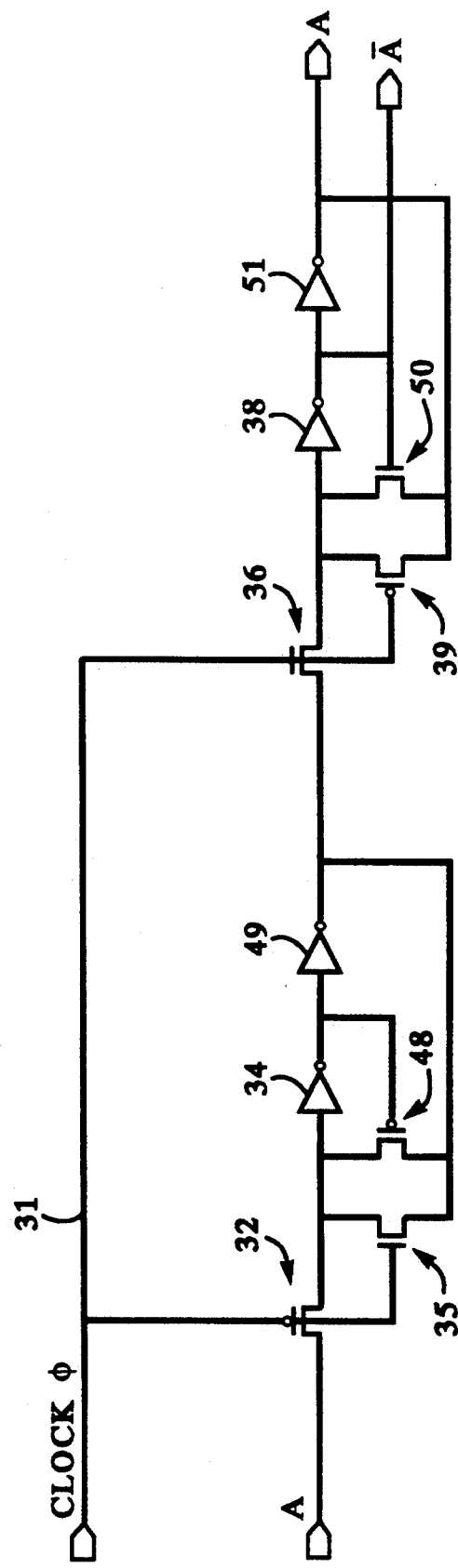
FIG. 5 is a circuit diagram of a third embodiment of the shift register shown in FIG. 3.

FIG. 5 illustrates one cell of a fourth embodiment of the current invention. This shift register is the same as the shift register shown in FIGS. 3 or 4, with added refresh circuitry. The first half of the shift register cell includes PMOS pass gate 32, inverters 34 and 49 which hold the passed value, or in the case of inverter 34 the inverse of the passed value, and feedback transistors 35 and 48, which refresh the bit values held in the cell. This configuration fully restores and maintains the voltage levels of both logical ONES and logical ZEROS, which enables the register to function even at low frequencies.

For example, when pass gate 36 passes a binary ZERO to inverter 38, the inverter presents to both transistor 50 and inverter 51 a logical ONE. In response, transistor 50 turns on, and inverter 51 presents to both feedback transistors 39 and 50 a binary ZERO. Transistor 39, which turns on when the clock signal goes low supplies to inverter 38 a degraded logical ZERO. Transistor 50, however, supplies to inverter 38 a full-valued binary ZERO signal which fully restores the input signal. Alternatively, when pass gate 36 passes a binary ONE, transistor 39 maintains the input of inverter 38 as a full-valued binary ONE. Thus the refresh circuitry fully restores and maintains the input of inverter 38 at either a binary ZERO or a binary ONE, as appropriate. Similarly, transistor 35 maintains the input of inverter 34 as a full binary ZERO when a ZERO is passed through pass gate 32 and, when a ONE is passed through pass gate 32, transistor 48 supplies to the input of inverter 34 a full-valued binary ONE.

Figure 6:
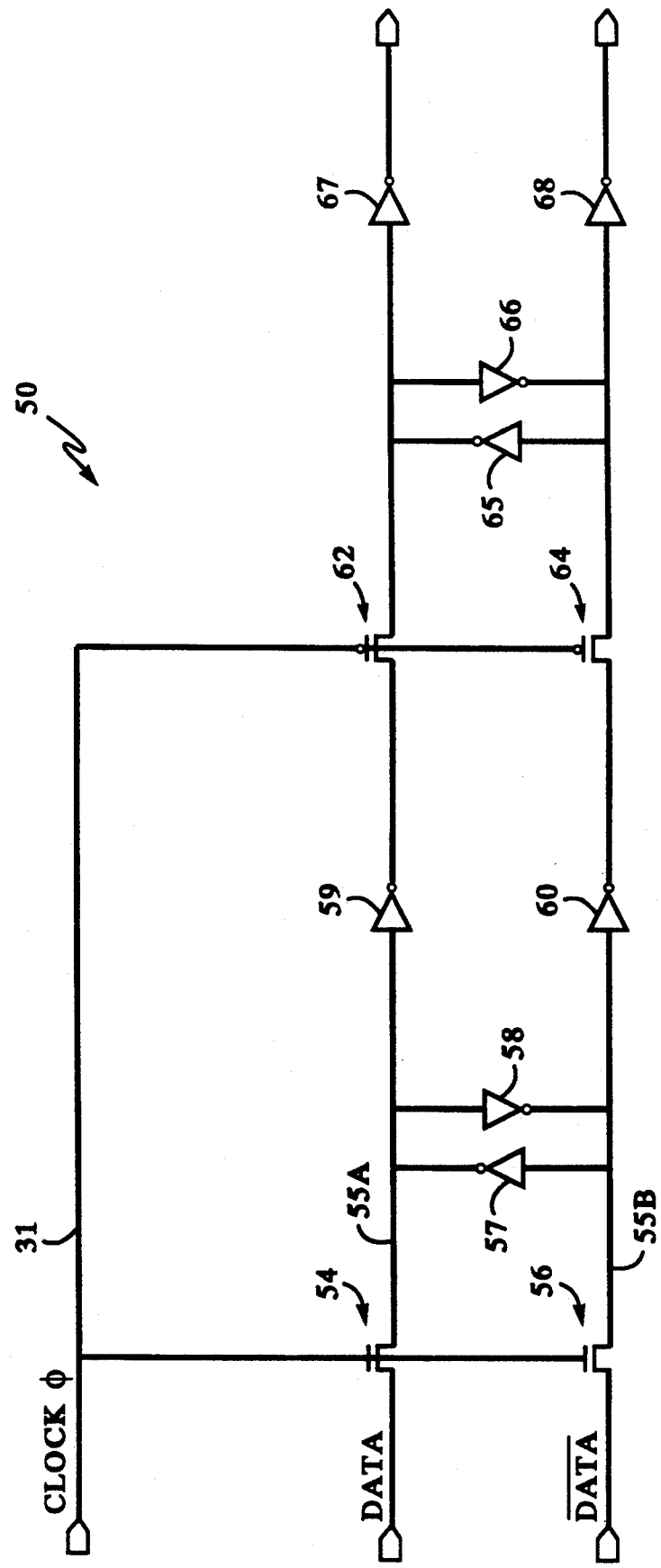
FIG. 6 is circuit diagram of a shift register constructed in accordance with a fourth embodiment of the invention.

FIG. 6 depicts yet another embodiment of the invention. A shift register 50 includes in each cell a set of dual pass gates, namely, two NMOS gates 54 and 56, and two PMOS gates, 62 and 64, all driven by a single clock signal. The cells also include refresh inverters 57-58 and 65-66 and buffer inverters 59-60 and 67-68, which all may be of standard design. The inverters need not be level-sensing inverters because, as described below, held bit values are always refreshed to their full binary values. Each cell requires two complementary data input values, namely, A and inverse A.

When the clock signal, $\phi$, goes high, dual pass gates 54 and 56 conduct and pass the values A and inverse A, respectively. If A is a binary ZERO, pass gate 54 passes a binary ZERO to node 55a and pass gate 56 passes a degraded logical ONE to node 55b. Inverter 58 thus receives the full-valued binary ZERO and inverts it to a binary ONE, which it then supplies to node 55b. Simultaneously, inverter 57 receives the degraded logical ONE from pass gate 56, inverts it and supplies the inverted signal to node 55a. Node 55a, which previously received a full-valued binary ZERO, however, remains at the full-valued voltage level. Inverters 59 and 60 receive signals corresponding to the full-valued voltage levels of node 55a and 55b. They then invert their logic states and supply them to pass gates 62 and 64.

The inverters also operate together to restore nodes 55a and 55b to logical ONE and ZERO values, respectively. The cell is thus written with the logic state passed through gates 54 and 56. Moreover, by the time the pass gates 62 and 64 are ready to conduct, nodes 55a and 55b have been restored by the various inverters to the appropriate full logic levels.

Shift register 50 requires complementary data values, instead of the complementary clock signals required by the prior art shift registers of FIG. 1. However, such data values are more easily supplied than are the two complementary clock signals. This is particularly true when the complementary data are present in the same or an adjacent cell. Further, complementary data values need not maintain an exact 180 degree phase shift relationship as is the case with prior art clock signals, as described above.

The various embodiments of the current invention each use a single clock line—and thus avoid the need for special clock generation and clock compensation circuitry. Accordingly, the inventive shift registers are smaller, less complex and less expensive to fabricate than CMOS shift registers which use two clock signals.

We claim:

1. A shift register for shifting binary data, said shift register including:
   A. a series of PMOS pass gates and NMOS pass gates, said pass gates being arranged such that said PMOS pass gates are adjacent to said NMOS pass gates;
   B. level-sensing inverters connecting said PMOS pass gates and said NMOS pass gates, said level-sensing inverters sensing passed values within predetermined voltage ranges of binary ONE and ZERO values and suppling inverted binary ZERO and ONE values, respectively;
   C. a clock for providing to said NMOS gates and said PMOS gates a single clock signal, wherein said PMOS pass gates pass values during one portion of the clock cycle and said NMOS pass gates pass values during another portion of the clock cycle; and
   D. refresh circuitry for refreshing held values, said refresh circuitry including for each pass gate—
      i. a complementary refresh pass gate driven by said clock signal;
      ii. a buffer inverter connected between an associated level sensing inverter and an adjacent pass gate, and
      iii. a non-complementary refresh pass gate having a source, a drain and a gate connected such that gate connects to the output line of said level sensing inverter, the drain connects to the drain of said complementary refresh pass gate and the source connects to the source of said complementary refresh pass gate.

2. The shift register of claim 1, wherein said PMOS pass gates are single PMOS transistors.

3. The shift register of claim 1, wherein said NMOS pass gates are single NMOS transistors.

4. A shift register for shifting binary data, said shift register including:
   A. a first series of PMOS pass gates and NMOS pass gates, said pass gates being arranged such that said PMOS pass gates are adjacent to said NMOS pass gates;
   B. a second series of PMOS pass gates and NMOS pass gates arranged in the same order as said first series;
   C. a clock for providing to said NMOS pass gates and said PMOS pass gates a single clock signal, wherein said PMOS pass gates pass values during one portion of the clock cycle and said NMOS pass gates pass values during another portion of the clock cycle;
   D. connecting circuitry between said PMOS pass gates and said NMOS pass gates in said first series, said connecting circuitry sensing a passed value and holding a corresponding binary valued signal;
   E. connecting circuitry between said PMOS pass gates and said NMOS pass gates in said second series, said connecting circuitry sensing a passed value and holding a corresponding binary valued signal; and
   F. refresh circuitry connected between PMOS gates in said first series and PMOS gates in said second series and between said NMOS gates in said first series and NMOS gates in said second series, said refresh circuitry refreshing the values held by said connecting circuitry to a voltage corresponding to a binary ZERO if said connecting circuitry is holding a binary ZERO or to a voltage corresponding to a binary ONE if said connecting circuitry is holding a binary ONE.

* * * * *